US011215922B2

(12) United States Patent
Chen

(10) Patent No.: US 11,215,922 B2
(45) Date of Patent: Jan. 4, 2022

(54) METHOD FOR MANUFACTURING A COLOR SLIDE FOR AN AUTOMOBILE PROJECTION LAMP

(71) Applicant: E-Lan Car Components (USA) Inc., Troy, MI (US)

(72) Inventor: Keng-Sheng Chen, New Taipei (TW)

(73) Assignee: E-LAN CAR COMPONENTS (USA) INC., Troy, MI (US)

( * ) Notice: Subject to any disclaimer, the term of this patent is extended or adjusted under 35 U.S.C. 154(b) by 395 days.

(21) Appl. No.: 16/510,853

(22) Filed: Jul. 12, 2019

(65) Prior Publication Data

US 2021/0011375 A1   Jan. 14, 2021

(51) Int. Cl.
| | |
|---|---|
| *B60Q 3/60* | (2017.01) |
| *G03F 7/00* | (2006.01) |
| *F21S 41/20* | (2018.01) |
| *C03C 17/36* | (2006.01) |
| *B60Q 1/26* | (2006.01) |

(Continued)

(52) U.S. Cl.
CPC ......... *G03F 7/0005* (2013.01); *B60Q 1/2665* (2013.01); *B60Q 3/60* (2017.02); *B60Q 3/70* (2017.02); *C03C 17/3602* (2013.01); *F21S 41/28* (2018.01); *B60Q 2400/50* (2013.01); *C03C 2218/15* (2013.01); *C03C 2218/34* (2013.01); *F21W 2104/00* (2018.01); *G03F 7/20* (2013.01); *G03F 7/30* (2013.01)

(58) Field of Classification Search
CPC ........ B60Q 3/60; B60Q 3/70; B60Q 2400/50; B60Q 1/2665; F21W 2104/00; F21W 41/28; C03C 17/3602; C03C 2218/15; C03C 2218/34; C03C 2218/33; G03F 7/0005; G03F 7/0007; G03F 7/20; G03F 7/105; G02B 5/20

USPC .......... 216/4, 24, 41; 430/292, 321
See application file for complete search history.

(56) References Cited

U.S. PATENT DOCUMENTS

| | | | |
|---|---|---|---|
| 10,738,960 B1 * | 8/2020 | Hellin Navarro | ...... B60Q 1/323 |
| 2012/0014005 A1 * | 1/2012 | Kliem | ...... B60R 1/06 |
| | | | 359/839 |

(Continued)

FOREIGN PATENT DOCUMENTS

| | | | |
|---|---|---|---|
| DE | 4341825 A1 * | 6/1994 | |
| DE | 102006036061 A1 * | 2/2008 | |

OTHER PUBLICATIONS

Computer-generated translation of DE 4341825 A1 (Jun. 1994). (Year: 1994).*

(Continued)

*Primary Examiner* — John A McPherson
(74) *Attorney, Agent, or Firm* — Juan Carlos A. Marquez; Marquez IP Law Office, PLLC

(57) ABSTRACT

A method for manufacturing a color slide for an automobile projection lamp includes: forming a plurality of same color pattern units on a glass substrate, each of the color pattern units being composed of a plurality of color coating layers. The plurality of color coating layers are formed by sequentially depositing materials having different colors on a surface of the glass substrate in accordance with different colors. Finally, the glass substrate is cut and separated in unit of one color pattern unit to form an independent color slide with the color pattern. The color slide can be mounted to an automobile projection lamp system for projecting the color pattern.

6 Claims, 5 Drawing Sheets

(51) Int. Cl.
*B60Q 3/70* (2017.01)
*F21W 104/00* (2018.01)
*G03F 7/20* (2006.01)
*G03F 7/30* (2006.01)

(56) References Cited

U.S. PATENT DOCUMENTS

2013/0130674 A1* 5/2013 De Wind ............... B60Q 1/323
                                                  455/420
2015/0375674 A1* 12/2015 Zharov ................... F21S 41/28
                                                  362/509

OTHER PUBLICATIONS

Computer-generated translation of DE 102006036061 B4 (Jul. 2012) (Year: 2012).*

* cited by examiner

METHOD FOR MANUFACTURING A COLOR SLIDE FOR AN AUTOMOBILE PROJECTION LAMP

BACKGROUND OF THE INVENTION

1. Field of the Invention

The present invention relates to a color slide mounted on an automobile projection lamp system, in particular to a method for manufacturing a color slide which can reduce the color fading of the color slide and enhance the projected performance of the color pattern.

2. The Prior Arts

In consideration of providing advanced visual sensation, ornamentality, sense of honor or luxury of the automobile, some models of automobile in the market are equipped with a projection lamp in a specific portion. A pattern or text image is projected on the ground or an appropriate position of the vehicle body when the lamp is activated. For example, the projection lamp can be mounted at the car door. When the car door is opened, the projection lamp is automatically activated to project the pattern or text image on the ground, thereby improving the visual sensation at night or in a low light environment. The pattern or text may be a factory emblem, a trademark of a car brand or any pattern or text.

Basically, the structure of a conventional automobile projection lamp includes a light source and a set of lenses respectively disposed at opposite ends of a hollow body. A slide having texts or patterns is disposed between the light source and the set of lenses. The patterns or texts on the color slide may be colored or uncolored. After a light projecting through the color slide from the light source, the patterns or texts printed on the color slide are focused by the set of lenses and projected onto the ground or a surface of an appropriate portion of the vehicle body.

The color slide used in the automobile projection lamp system is manufactured by printing a color pattern on a glass substrate. However, since the printing ink is an organic material, the color pattern is easy to fade after being irradiated by the light emitted by the light source. In particular, most of the current car projection lamps use a power-saving and long-life light-emitting diode (LED) as a light source, and a blue light included in the light emitted by the LED is likely to cause organic substances in the ink to oxidize, thereby accelerate the fading of the color pattern. In addition, since the precision of the slide is difficult to be controlled in a printing process and the problem of ink fluidity, the definition of the printing pattern or text will be affected, which degrades the quality performance of the color pattern or the text images projected by the projection lamp.

SUMMARY OF THE INVENTION

An objective of the present invention is to provide a method for manufacturing a color slide for an automobile projection lamp. The manufacturing method can reduce the fading of color patterns or texts formed on the color slide, and improve the quality performance of the projected pattern or text images.

The present invention provides a method for manufacturing a color slide for an automobile projection lamp, the color slide formed with a color pattern of two or more colors. The method comprises: forming a plurality of same color pattern units on a glass substrate, wherein each of the color pattern unit is composed of a plurality of color coating layers. The plurality of color coating layers are formed by sequentially depositing materials having different colors on a surface of the glass substrate in accordance with different colors. Finally the glass substrate is cut and separated in unit of one color pattern unit to form an independent color slide with the color pattern.

The manufacturing method according to the present invention may include the following steps: (1) providing a glass substrate; (2) depositing a material having a first color on a surface of the glass substrate to form a first color coating layer; (3) forming a photoresist layer on the first color coating layer; (4) exposing and developing a plurality of first partial patterns on the photoresist layer; (5) removing the first color coating layer except the first partial patterns by an etching process; (6) repeating the aforementioned steps (2) to (5) in accordance with the number (n+1) of the rest of patterns to be formed, wherein the "first" is replaced by the "n+1", and the n is a natural number of 1 or more; (7) removing the photoresist layer to expose the first partial pattern having the first color coating layer and the (n+1)th partial pattern having the (n+1)th color coating layer, wherein the first partial pattern and the (n+1)th partial pattern together constitute the color pattern unit; and (8) cutting and separating the glass substrate in unit of one color pattern unit to form a plurality of independent color slides with the color pattern.

The present invention preferably arranges the color pattern units in a matrix on the glass substrate to facilitate cutting and separating the color pattern units.

The present invention can employ vacuum evaporation, vacuum magnetron sputtering or chemical vapor deposition to form the color coating layers on the glass substrate.

According to the aforementioned method for manufacturing a color slide of the present invention, since the color coating layers are formed on the glass substrate by vacuum evaporation, vacuum magnetron sputtering or chemical vapor deposition, the color coating layers have better adhesion and anti-oxidation than that formed by printing. Hence, it is not easy to fade after being exposed to the light source for a long time, and it is easy to control the precision of forming color patterns or texts in the coating process, so that the projected pattern or text images have a better quality performance.

DETAILED DESCRIPTION OF THE PREFERRED EMBODIMENT

The other purposes and functions of the present invention will be further described in conjunction with the drawings, let those skilled in the art can understand the present invention; wherein, the "pattern" described below is a general term for expressing visual images including graphics, characters, numbers, symbols, lines, and the like.

Figure 1:
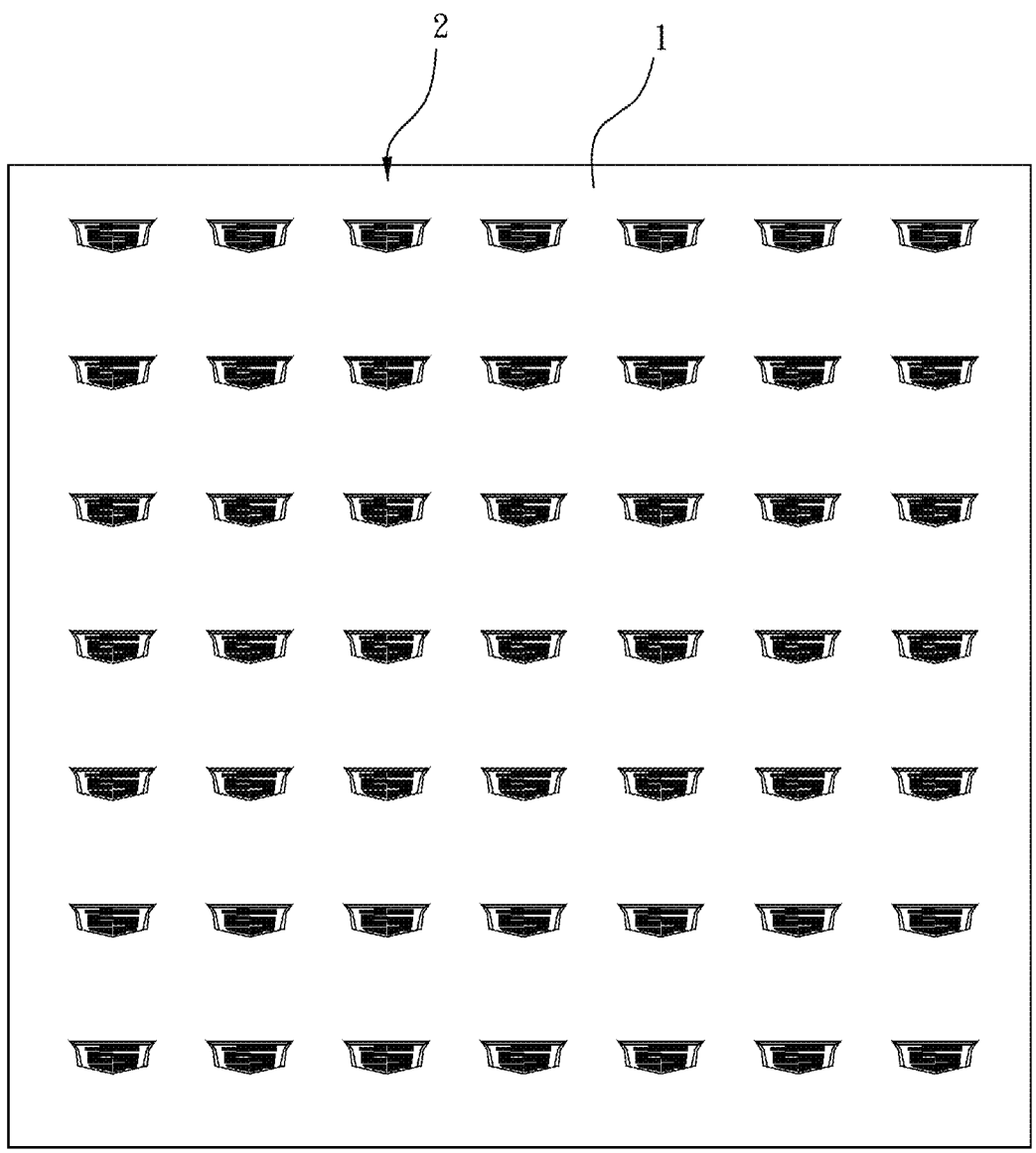
FIG. 1 illustrates a plan view of a plurality of color pattern units formed on a glass substrate by the method of the present invention.
Figure 2:
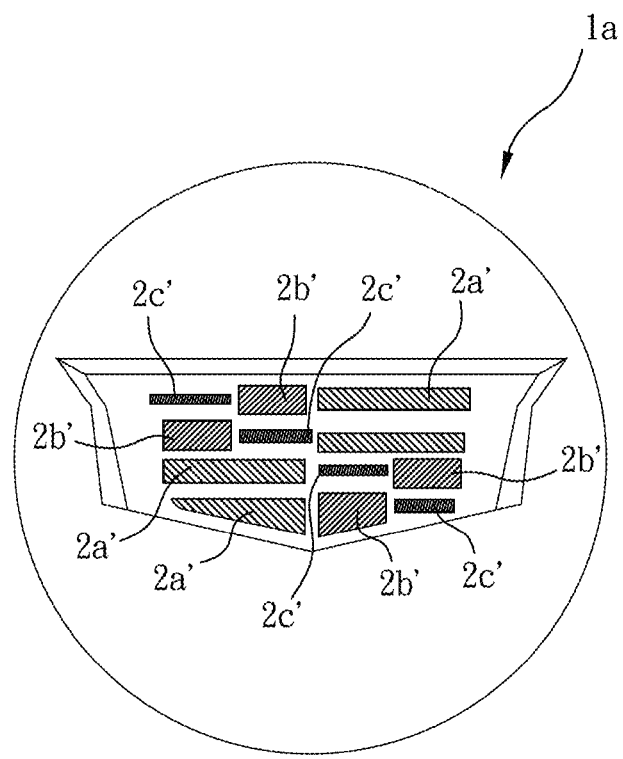
FIG. 2 illustrates a schematic view of a color slide formed by cutting and separating a color pattern unit on a glass substrate.

A method for manufacturing a color slide for an automobile projection lamp according to a preferred embodiment of the present invention includes: (1) providing a glass substrate; (2) depositing a material having a first color on a surface of the glass substrate to form a first color coating layer; (3) forming a photoresist layer on the first color coating layer; (4) exposing and developing a plurality of first partial patterns on the photoresist layer; (5) removing the first color coating layer except the first partial pattern by an etching process; (6) repeating the number of steps (2) to (5) above in accordance with the number (n+1) of the rest of patterns to be formed, wherein the "first" is replaced by the "n+1", and the n is a natural number of 1 or more; (7) removing the photoresist layer to expose the first partial pattern having the first color coating layer and the (n+1)th partial pattern having the (n+1)th color coating layer, wherein the first partial pattern and the (n+1)th partial pattern together constitute the color pattern unit 2 (as shown in FIGS. 1); and (8) cutting and separating the glass substrate in unit of one color pattern unit to form a plurality of independent color slides 1a with the color pattern (as shown in FIG. 2).

Specifically, the present invention can employ a colorless glass as the glass substrate 1. The color material may be a metal, an alloy or a metal compound material. Materials having different colors may be separately deposited on the glass substrate 1 by vacuum sputtering, vacuum magnetron sputtering, or chemical vapor deposition or the like to form a color pattern unit 2. That is, each of the color pattern unit 2 includes a variety of colors. Based on the economic consideration of mass production, the color pattern units 2 are preferably arranged in a matrix on the glass substrate 1, and each of the color pattern units 2 is identical to each other. Hereinafter, only the formation process of one of the color pattern units 2 is described below. It should be understood that forming a plurality of color pattern units 2 on the glass substrate 1 is performed simultaneously and completed simultaneously. Since the same color in different positions may be included in one color pattern unit 2, herein, the patterns of the first same color are collectively referred to as the first partial pattern 2a', the patterns of the second same color are collectively referred to as the second partial pattern 2b', and so on.

Figure 3:
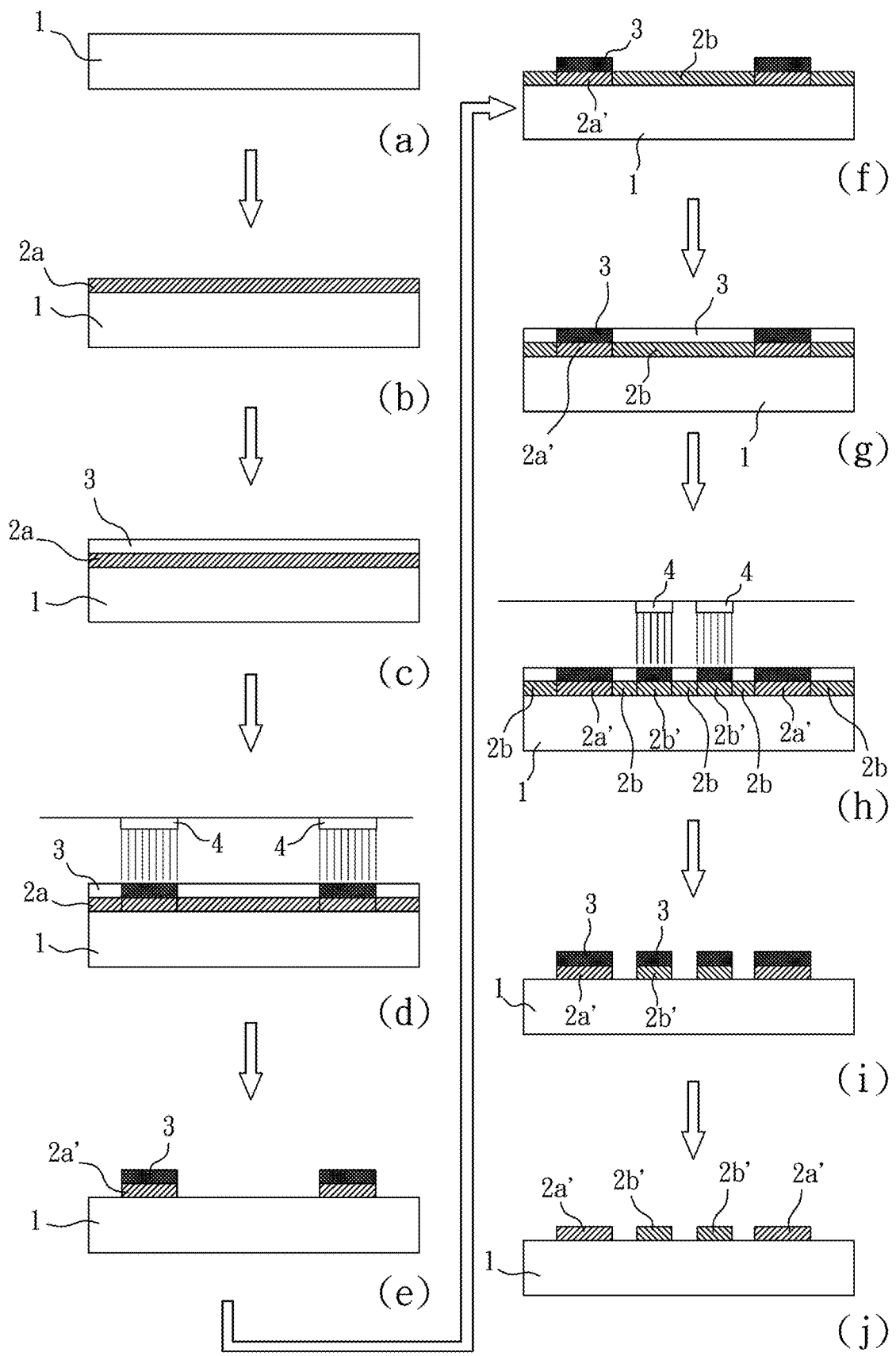
FIG. 3 illustrates a schematic view of two different color coating layers formed on the glass substrate according to the present invention.

As shown in (a) to (e) of FIG. 3, the manufacturing method of the present invention comprises: firstly, providing a cleaned glass substrate 1 (as shown in (a) of FIG. 3); forming a first color coating layer 2a on a surface of the glass substrate 1 with a material having a first color (as shown in (b) of FIG. 3), wherein the first color coating layer 2a is the first color finally formed in the color pattern unit 2 on a slide; coating a photoresist as a photosensitive material on the first color coating layer 2a to form a photoresist layer 3 (as shown in (c) of FIG. 3); exposeing and developing the first partial pattern 2a' to be formed on the photoresist layer 3 by a photomask 4 (as shown in (d) of FIG. 3); and then etching away the first color coating layer 2a other than the first partial pattern 2a' masked by the exposed photoresist layer 3 (as shown in (e) of FIG. 3), so that the remaining first color coating layer 2a is formed as the first partial pattern 2a'.

(f) to (j) of FIG. 3 shows a process of forming the second color coating layer 2b (i.e., the second partial pattern 2b') after the first color coating layer 2a (i.e., the first partial pattern 2a') has been formed on the glass substrate 1. Specifically, the second color coating layer 2b is formed on the surface of the glass substrate 1 with a material having a second color (as shown in (f) of FIG. 3). The second color coating layer 2b is the second color finally formed in the color pattern unit 2 on the slide; and then a photoresist is coated on the second color coating layer 2b to form a photoresist layer 3 (as shown in (g) of FIG. 3). Next, the photomask 4 (as shown in (h) of FIG. 3) is used to expose and develop the second partial pattern 2b' to be formed on the photoresist layer 3. After that, the second color coating layer 2b other than the second partial pattern 2b' masked by the exposed photoresist layer 3 is etched away (as shown in (i) of FIG. 3), so that the second color coating layer 2b is formed as the second partial pattern 2b'. If the color pattern unit 2 includes only two colors, the process of removing the photoresist layer 3 is performed after the first color coating layer 2a and the second color coating layer 2b have been formed, so that the color pattern unit 2 including the first partial pattern 2a' and the second partial pattern 2b' is formed on the glass substrate 1 (as shown in (j) of FIG. 3).

If the color pattern unit 2 includes a third color, a third color coating layer (i.e., the third partial pattern 2c') is formed after the first color coating layer 2a (i.e., the first partial pattern 2a') and the second color coating layer 2b (i.e., the second partial pattern 2b') have been formed on the glass substrate 1. That is, the third color coating layer is formed on the surface of the glass substrate 1 with a material having the third color, and then a photoresist coated on the third color coating layer to form a photoresist layer. Next, the photomask is used to expose and develop the third partial pattern to be formed on the photoresist layer. After that, the third color coating layer other than the third partial pattern masked by the exposed photoresist layer is etched away by an etching process, so that the third color coating layer is formed as the third partial pattern. If the color pattern unit includes a fourth color or more, the foregoing steps are repeated to sequentially form a plurality of color coating layers on the glass substrate.

After the plurality of color pattern units have been formed on the glass substrate 1, a cutting process is performed to cut the glass substrate 1 including the color pattern units 2 into a plurality of color slides 1a.

Figure 4:
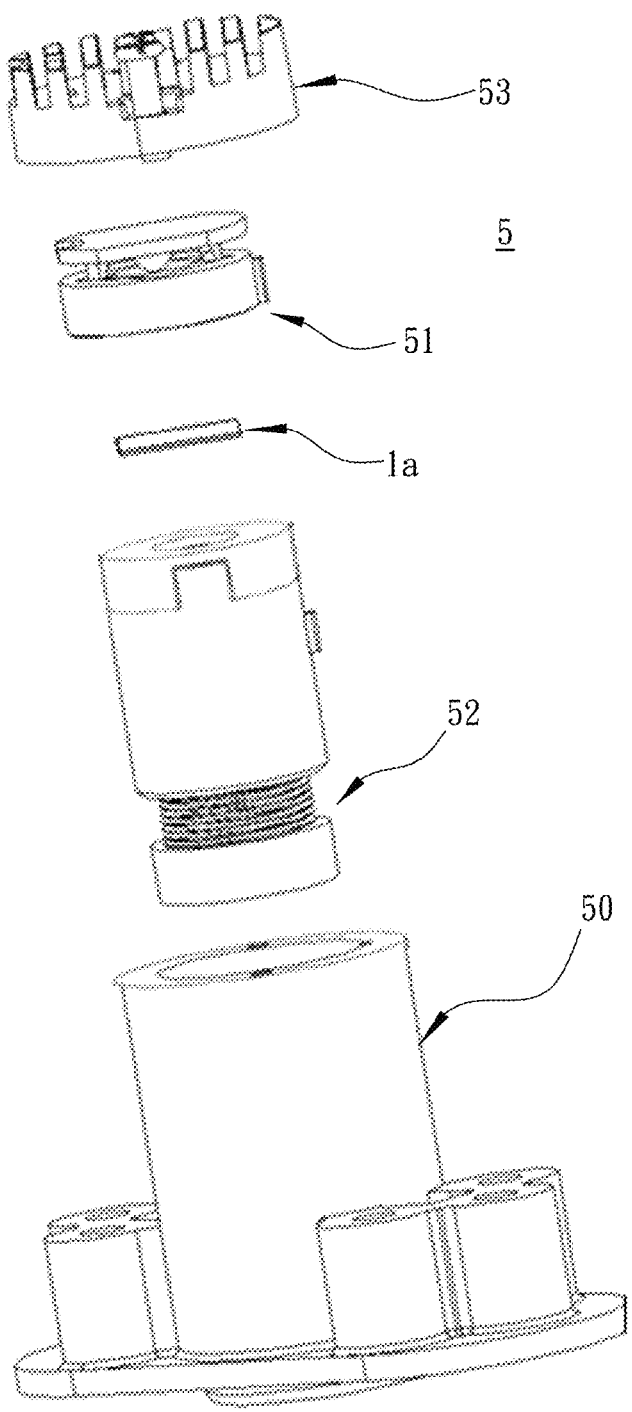
FIG. 4 illustrates an exploded perspective view of an embodiment of the present invention wherein the color slide is mounted on an automobile projection lamp system.
Figure 5:
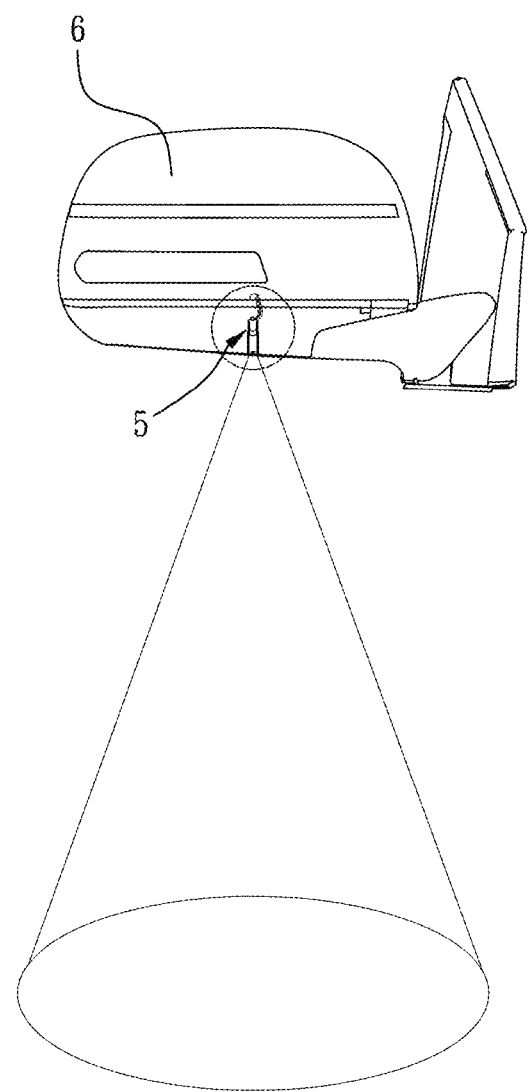
FIG. 5 illustrates a schematic diagram of a pattern image projected by an automobile projection lamp system.

The completed color slide 1a is provided to be an element mounted in the automobile projection lamp system 5, as shown in FIG. 4 and FIG. 5. The automobile projection lamp system 5 generally includes a body 50, a light source 51, the color slide 1a, at least one set of lenses 52 and a heat dissipation module 53. Wherein, the body 50 is provided at a specific position of the automobile, and the body 50 has an inner space penetrating from a first end to a second end. The light source 51 preferably uses a light emitting diode (LED), and the light source 51 is disposed at the first end in the body 50, so that the light source 51 can project light toward the second end of the body 50. The heat dissipation module 53 is disposed at the first end of the body 50 for absorbing and dissipating the heat generated by the light source 51. The set of lenses 52 is disposed at the second end of the body 50. The light source 51 is electrically connected to a power system of the automobile. When the light source 51 is powered on to project light, the light passes through the color slide 1a having the color pattern unit 2, then a color image corresponding to the color pattern unit 2 is generated, and the color image is projected on a surface of an object through focusing by the set of lenses 52.

The automobile projection lamp system 5 can be mounted to a rearview mirror housing 6 of the automobile, the ceiling of the interior of the automobile, the bumper of the automobile, the interior panel of the automobile, and the like.

The color pattern unit 2 on the color slide 1a may be various possible patterns such as traffic rule gestures, geometric figures, photos, cartoon pictures, and the like. In addition to the warning function, the color image generated by the color pattern unit can also produce a visual sense to enhance the added value.

In addition to forming the color pattern unit 2, the color slide 1a may form a warning message such as "PAUSE", "STOP", "CAUTION", "ATTENTION", and the like.

The light source 51 is electrically connected to the power system of the automobile, and the timing when the power is turned on can be automatically controlled by a circuit. For example, it can be set to automatically emit light to project a warning message or a creative color pattern image when braking, stopping, turning, opening the door, etc., but when the aforementioned conditions are stopped, the light source is powered off and does not emit light. On the other hand, the light source can be continuously illuminating by manual control.

The above description is only for explaining the preferred embodiments of the present invention, and is not intended to limit the present invention. Therefore, any form of the changes should be included in the scope of the invention as claimed.

What is claimed is:

1. A method for manufacturing a color slide for an automobile projection lamp, the color slide formed with a color pattern of two or more colors, the method comprising:
    forming a plurality of same color pattern units on a glass substrate, each of the color pattern units being composed of a plurality of color coating layers, wherein the plurality of color coating layers are formed by sequentially depositing materials having different colors on a surface of the glass substrate in accordance with different colors, and finally the glass substrate is cut and separated in unit of one color pattern unit to form an independent color slide with the color pattern.

2. The method of claim 1, wherein the color pattern units are arranged in a matrix on the glass substrate.

3. The method of claim 1, wherein a metal material having a color is deposited on the glass substrate by vacuum evaporation, vacuum magnetron sputtering, or chemical vapor deposition to form the plurality of color coating layers.

4. A method for manufacturing a color slide for an automobile projection lamp, the color slide formed with a color pattern of two or more colors, the method comprising the following steps:
    (1) providing a glass substrate;
    (2) depositing a material having a first color on a surface of the glass substrate to form a first color coating layer;
    (3) forming a photoresist layer on the first color coating layer;
    (4) exposing and developing a plurality of first partial patterns on the photoresist layer;
    (5) removing the first color coating layer except the first partial patterns by an etching process;
    (6) repeating the aforementioned steps (2) to (5) in accordance with the number (n+1) of the rest of patterns to be formed, wherein the "first" is replaced by the "n+1", and the n is a natural number of 1 or more;
    (7) removing the photoresist layer to expose the first partial pattern having the first color coating layer and the (n+1)th partial pattern having the (n+1)th color coating layer, wherein the first partial pattern and the (n+1)th partial pattern together constitute a color pattern unit; and
    (8) cutting and separating the glass substrate in unit of one color pattern unit to form a plurality of independent color slides with the color pattern.

5. The method of claim 4, wherein the color pattern units are arranged in a matrix on the glass substrate.

6. The method of claim 4, wherein a metal material having a color is deposited on the glass substrate by vacuum evaporation, vacuum magnetron sputtering, or chemical vapor deposition to form the plurality of color coating layers.

* * * * *